United States Patent
Tian et al.

(10) Patent No.: US 11,139,356 B2
(45) Date of Patent: Oct. 5, 2021

(54) ARRAY SUBSTRATE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Dong Li, Beijing (CN); Chunyang Wang, Beijing (CN); Ming Liu, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/766,905

(22) PCT Filed: Oct. 18, 2019

(86) PCT No.: PCT/CN2019/111859
§ 371 (c)(1),
(2) Date: May 26, 2020

(87) PCT Pub. No.: WO2020/173102
PCT Pub. Date: Sep. 3, 2020

(65) Prior Publication Data
US 2021/0210560 A1    Jul. 8, 2021

(30) Foreign Application Priority Data

Feb. 26, 2019 (CN) .......................... 201910140616.1

(51) Int. Cl.
*H01L 27/32* (2006.01)
*H01L 29/786* (2006.01)
*H01L 51/56* (2006.01)

(52) U.S. Cl.
CPC .......... *H01L 27/326* (2013.01); *H01L 27/322* (2013.01); *H01L 29/78618* (2013.01); *H01L 51/56* (2013.01); *H01L 2227/323* (2013.01)

(58) Field of Classification Search
CPC ............................ H01L 27/322; H01L 27/326
See application file for complete search history.

(56) References Cited

U.S. PATENT DOCUMENTS

2007/0257253 A1    11/2007 Im et al.
2008/0265370 A1    10/2008 Kageyama
(Continued)

FOREIGN PATENT DOCUMENTS

CN    101114668 A    1/2008
CN    106206426 A    12/2016
(Continued)

OTHER PUBLICATIONS

"First Office Action and English language translation", CN Application No. 201910140616.1, dated Jul. 3, 2020, 26 pp.
(Continued)

*Primary Examiner* — Douglas M Menz
(74) *Attorney, Agent, or Firm* — Myers Bigel, P.A.

(57) ABSTRACT

The present disclosure discloses an array substrate with a display area, a manufacturing method thereof, a display panel, and a display device. The array substrate with the display area includes a base substrate, and a thin film transistor structure on a surface of the base substrate. The thin film transistor structure is in the display area, the thin film transistor structure includes at least a source-drain pattern and a planarization pattern. The source-drain pattern and the planarization pattern are on a side of the thin film transistor structure away from the base substrate. A surface of the planarization pattern away from the base substrate and a surface of the source-drain pattern away from the base (Continued)

substrate are substantially in a same plane, the planarization pattern has a first slot, and the source-drain pattern is accommodated in the first slot.

20 Claims, 5 Drawing Sheets

(56) References Cited

U.S. PATENT DOCUMENTS

| | | |
|---|---|---|
| 2018/0226458 A1 | 8/2018 | Bai et al. |
| 2020/0243574 A1 | 7/2020 | Tian et al. |
| 2020/0328264 A1 | 10/2020 | Wu et al. |

FOREIGN PATENT DOCUMENTS

| | | |
|---|---|---|
| CN | 106601133 A | 4/2017 |
| CN | 106601778 A | 4/2017 |
| CN | 107978617 A | 5/2018 |
| CN | 108565358 A | 9/2018 |
| CN | 108695370 A | 10/2018 |
| CN | 108899334 A | 11/2018 |
| CN | 108933179 A | 12/2018 |
| CN | 109801954 A | 5/2019 |

OTHER PUBLICATIONS

"International Search Report and English language translation", International Application No. PCT/CN2019/111859, dated Jan. 16, 2020, 13 pp.

ARRAY SUBSTRATE AND MANUFACTURING METHOD THEREOF, DISPLAY PANEL AND DISPLAY DEVICE

RELATED APPLICATIONS

The present application is a 35 U.S.C. 371 national stage application of PCT International Application No. PCT/CN2019/111859, filed on Oct. 18, 2019, which claims the benefit of Chinese Patent Application No. 201910140616.1, filed on Feb. 26, 2019, the entire disclosures of which are incorporated herein by reference.

TECHNICAL FIELD

The present disclosure relates to the field of display technology, and in particular, to an array substrate, a manufacturing method thereof, a display panel, and a display device.

BACKGROUND

Organic light-emitting diode (OLED), as a current-type light-emitting device, has the characteristics of low power consumption, self-luminescence, high color saturation, fast response, wide viewing angle, and possible flexibility. It is increasingly used in the field of high-performance displays. The current OLED display panel generally uses a circular polarizer to reduce external reflected light. The circular polarizer is attached to the light exit surface of the OLED display panel, and the circular polarizer can reduce the amount of light emitted from the light exit surface after the ambient light entering the OLED display panel is reflected by the internal structure of the OLED display panel. The light exit effect of OLED display panels still needs to be improved.

SUMMARY

In a first aspect, an array substrate with a display area is provided. The array substrate includes: a base substrate, and a thin film transistor structure on a surface of the base substrate. The thin film transistor structure is in the display area; the thin film transistor structure includes at least a source-drain pattern and a planarization pattern. The source-drain pattern and the planarization pattern are on a side of the thin film transistor structure away from the base substrate. A surface of the planarization pattern away from the base substrate and a surface of the source-drain pattern away from the base substrate are substantially in a same plane, the planarization pattern has a first slot, and the source-drain pattern is accommodated in the first slot.

Optionally, the array substrate further includes a non-display area adjacent to the display area and a trace in the non-display area. The base substrate is a flexible base substrate. The non-display area includes a bending area, the bending area has a second slot, and an organic filler is provided in the second slot. The trace is on a side of the organic filler away from the base substrate.

Optionally, the planarization pattern and the organic filler are formed by a same process.

Optionally, the array substrate further includes a planarization layer. The planarization layer is on a side of the source-drain pattern away from the base substrate.

Optionally, the thin film transistor structure further includes an active layer pattern, a passivation layer, and a gate pattern sequentially disposed on the base substrate. The source-drain pattern is connected to the active layer pattern via a through hole passing through the passivation layer.

Optionally, the thin film transistor structure further includes a gate pattern, an interlayer insulating layer, and an active layer pattern sequentially disposed on the base substrate. The source-drain pattern is connected to the active layer pattern.

In a second aspect, a display panel is provided. The display panel includes the array substrate according to any embodiment of the first aspect.

Optionally, the display panel further includes a first electrode, a light-emitting layer, a second electrode, and a color filter stacked on a side of the planarization pattern away from the base substrate. The first electrode and the second electrode are a cathode and an anode, respectively.

Optionally, the display panel has two parallel sides disposed opposite to each other. The display area includes a plurality of pixels, and an arrangement direction of the plurality of pixels is different from the two parallel sides.

In a third aspect, a display device is provided. The display device includes the display panel according to any embodiment of the second aspect.

In a fourth aspect, a method of manufacturing an array substrate having a display area is provided. The method includes: providing a base substrate; and forming a thin film transistor structure on the base substrate, the thin film transistor structure being in the display area. The step of forming the thin film transistor structure on the base substrate at least includes: forming a planarization pattern on the base substrate, the planarization pattern having a first slot; and forming a source-drain pattern in the first slot. A surface of the planarization pattern away from the base substrate and a surface of the source-drain pattern away from the base substrate are substantially in a same plane.

Optionally, the step of forming the planarization pattern on the base substrate includes: coating an organic material on the base substrate to form an organic material layer in the display area, a thickness of the organic material layer being greater than or equal to a thickness of the source-drain pattern; and performing an exposure and development process on the organic material layer in the display area to obtain the planarization pattern.

Optionally, the array substrate further includes a non-display area adjacent to the display area, the base substrate is a flexible base substrate, and the non-display area includes a bending area. Before coating the organic material on the base substrate, the method further includes: etching an inorganic film layer in the bending area to form a second slot. The step of coating the organic material on the base substrate includes: filling the organic material in the second slot to form an organic filler in the second slot.

Optionally, the array substrate includes a trace in the bending area. While forming the source-drain pattern in the first slot, the method further includes forming the trace on a side of the organic filler away from the base substrate through a patterning process.

Optionally, a thickness of the organic material layer is greater than a thickness of the source-drain pattern. After the planarization pattern is obtained, the method further includes: performing an exposure process on the planarization pattern using a half-tone mask; and performing a development process on the planarization pattern after the exposure process is performed so that a thickness of the planarization pattern after the development process is equal to the thickness of the source-drain pattern.

Optionally, a thickness of the organic material layer is greater than a thickness of the source-drain pattern; after the planarization pattern is obtained, the method further includes: performing an ashing process on the planarization pattern to ash the planarization pattern so that a thickness of the planarization pattern after the ashing process is equal to the thickness of the source-drain pattern.

BRIEF DESCRIPTION OF THE DRAWINGS

In order to more clearly illustrate the technical solutions in embodiments of the disclosure or in the prior art, the appended drawings needed to be used in the description of the embodiments or the prior art will be introduced briefly in the following. Obviously, the drawings in the following description are only some embodiments of the disclosure, and for those of ordinary skills in the art, other drawings may be obtained according to these drawings under the premise of not paying out creative work.

DETAILED DESCRIPTION OF THE DISCLOSURE

In the following, the technical solutions in embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The related art provides a color filter on encapsulation (COE) technology, which encapsulates the color filter on the light exit side of the OLED display panel. Due to the filtering effect of the color filter on the light, after the ambient light entering the OLED display panel is reflected by the internal structure of the OLED display panel, the amount of light emitted from the light exit surface can be reduced. In addition, compared with circular polarizers, color filters have higher light transmittance and better flexibility, so COE technology has been developed.

The OLED display panel includes an array substrate and a light-emitting device on the array substrate. With the improvement of the resolution of OLED display panels, the thickness of the source-drain pattern of the thin film transistor (TFT) in the array substrate is getting larger and larger. Since the array substrate has a stack structure with multiple film layers, a thick source-drain pattern will reduce the flatness of the array substrate, and it is easy to cause the surface of the lower electrode in the light-emitting device to be uneven. Therefore, in the existing COE technology, when the OLED display panel is in a screen-off state, external light enters the OLED display panel and is reflected by the surface of the lower electrode, concentrated reflection in a certain direction is likely to occur. This will cause the color separation phenomenon of the reflected light after passing through the color filter, and then cause the reflected image to be distorted. Therefore, the reliability of the OLED display panel in the related art is low.

Figure 1:
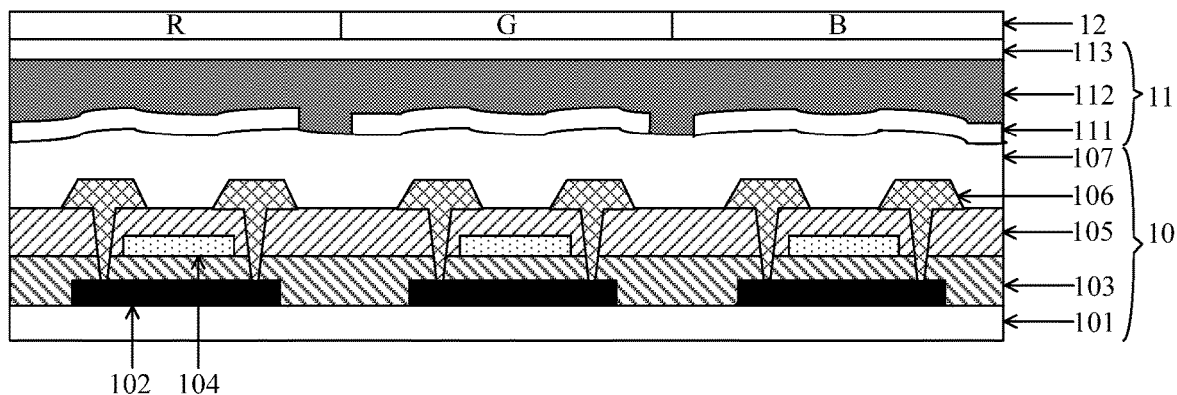
FIG. 1 is a schematic structural diagram of an OLED display panel provided in the related art.

FIG. 1 is a schematic structural diagram of an OLED display panel provided in the related art. As shown in FIG. 1, the OLED display panel includes an array substrate 10, a light-emitting device 11 on the array substrate 10, and a color filter 12 on the light exit side of the light-emitting device 11. Referring to FIG. 1, the array substrate 10 includes a base substrate 101. An active layer 102, a passivation layer 103, a gate pattern 104, an interlayer insulating layer 105, a source-drain pattern 106, and a planarization layer 107 are stacked on the base substrate 101. The light-emitting device 11 includes a first electrode 111, a light-emitting layer 112, and a second electrode 113. The color filter 12 has a red filter region R, a green filter region G, and a blue filter region B.

As the resolution of the OLED display panel increases, the thickness of the source-drain pattern becomes larger and larger. Referring to FIG. 1, since the thickness of the source-drain pattern 106 is large, the flatness of the planarization layer 107 formed on the side of the source-drain pattern 106 away from the base substrate 101 is poor, which further results in the uneven surface of the first electrode 111. When external light (especially strong light) enters the interior of the OLED display panel and is reflected by the surface of the first electrode 111, due to the uneven surface of the first electrode 111, concentrated reflection in a certain direction is likely to occur. After the reflected light passes through the regions R, G, and B on the color filter, color separation will occur, which will cause distortion of the reflected image. The reflected image refers to an image formed by reflecting external light when the OLED display panel is in a screen-off state.

Figure 2:
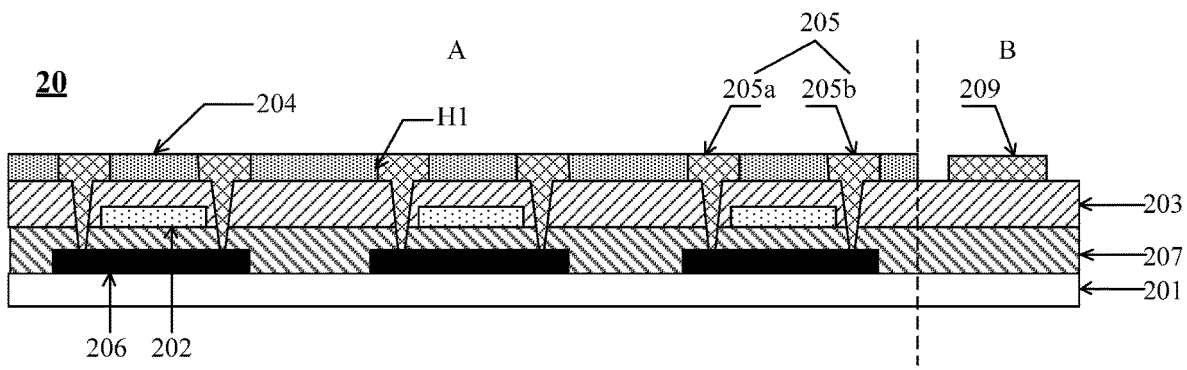
FIG. 2 is a schematic structural diagram of an array substrate provided by an embodiment of the present disclosure.

FIG. 2 is a schematic structural diagram of an array substrate provided by an embodiment of the present disclosure. As shown in FIG. 2, the array substrate 20 has a display area A and a non-display area B located around the display area A. The array substrate 20 includes: a base substrate 201, and a thin film transistor structure on a surface of the base substrate. The thin film transistor structure is in the display area. The thin film transistor structure includes at least a source-drain pattern 205 and a planarization pattern 204. The source-drain pattern 205 and the planarization pattern 204 are on a side of the thin film transistor structure away from the base substrate 201. As shown in FIG. 2, a surface of the planarization pattern 204 away from the base substrate 201 and a surface of the source-drain pattern 205 away from the base substrate are substantially in the same plane. The planarization pattern 204 has a first slot H1, and the source-drain pattern 205 is accommodated in the first slot H1. It should be noted that "substantially in the same plane" means that the segment difference between the surfaces of two layers does not exceed 20% of the thickness of one of the layers, such as 15%, 10%, or 5% of the thickness of one of the layers. In the present disclosure, the segment difference between the surface of the planarization pattern 204 away from the base substrate 201 and the surface of the source-drain pattern 205 away from the base substrate 201 may not exceed 20% of the thickness of the planarization pattern 204, specifically, it may not exceed 15%, 10%, 5%, etc. of the thickness of the planarization pattern 204. Alternatively, the segment difference may not exceed 20% of the thickness of the source-drain pattern 205, specifically, it may not exceed 15%, 10%, 5%, etc. of the thickness of the planarization pattern 204.

The source-drain pattern 205 includes a source electrode 205a and a drain electrode 205b.

Figure 3:
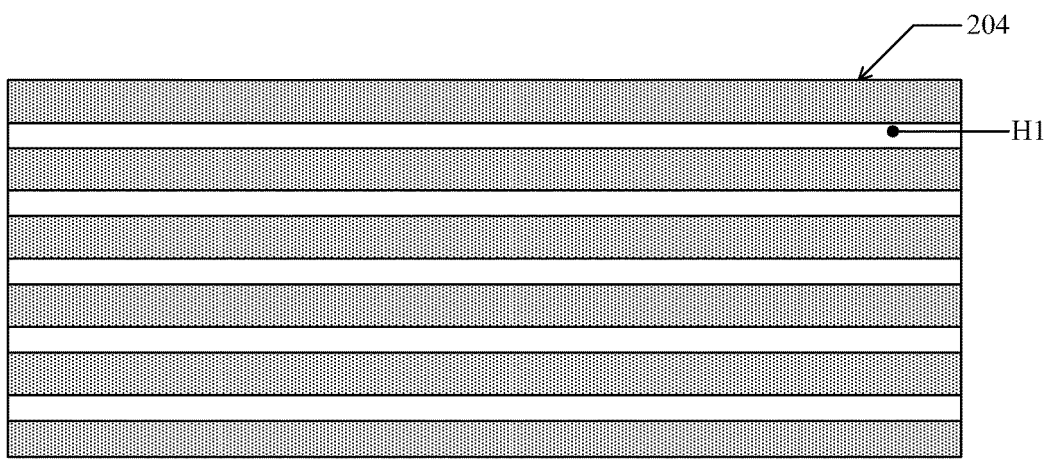
FIG. 3 is a schematic top view of a planarization pattern provided by an embodiment of the present disclosure.

FIG. 3 is a schematic top view of a planarization pattern provided by an embodiment of the present disclosure. As shown in FIG. 3, the planarization pattern 204 has the first slot H1 accommodating the source electrode 205a and the drain electrode 205b.

Optionally, the thickness of the planarization pattern is equal to the thickness of the source-drain pattern. The thickness of the planarization pattern and the source-drain pattern ranges from 300 to 800 nm.

It should be noted that the thickness of the source-drain pattern refers to the thickness of the portion of the source-drain pattern located in the first slot of the planarization pattern, excluding the thickness of the portion of the source-drain pattern located in the through hole.

Optionally, the material of the gate pattern includes at least one of aluminum (Al), neodymium (Nd), and molybdenum (Mo); the material of the source-drain pattern includes at least one of aluminum, neodymium, and molybdenum; the material of the planarization pattern includes organic materials such as polyimide (PI) and acrylic (polymethyl methacrylate, PMMA). The embodiments of the present disclosure do not limit the material of each film layer.

Figure 4:
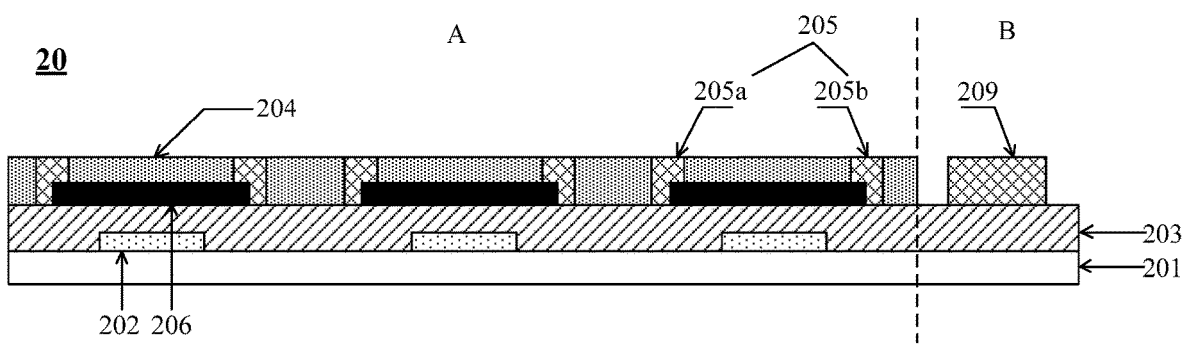
FIG. 4 is a schematic structural diagram of an array substrate provided by another embodiment of the present disclosure.

The thin film transistor structure in the embodiment of the present disclosure may be a top gate structure or a bottom gate structure. When the thin film transistor structure is a top gate structure, referring to FIG. 2, the thin film transistor gate structure further includes an active layer pattern 206, a passivation layer 207, and a gate pattern 202 that are sequentially disposed on the base substrate 201. The source-drain pattern 205 is connected to the active layer pattern 206 via a through hole passing through the passivation layer 207. FIG. 4 is a schematic structural diagram of an array substrate provided by another embodiment of the present disclosure. When the thin film transistor structure is a bottom gate structure, referring to FIG. 4, the thin film transistor structure further includes a gate pattern 202, an interlayer insulating layer 203, and an active layer pattern 206 sequentially disposed on the base substrate 201. The source-drain pattern 205 is connected to the active layer pattern 206. In the following embodiments of the present disclosure, the thin film transistor structure is a top gate structure, which will be described as an example.

In summary, in the array substrate provided by the embodiments of the present disclosure, the surface of the planarization pattern away from the base substrate and the surface of the source-drain pattern away from the base substrate are substantially in the same plane. Moreover, the planarization pattern has the first slot for accommodating the source-drain pattern, that is, the source-drain pattern can be accommodated in the first slot of the planarization pattern. Therefore, the problem of poor flatness of the array substrate due to the large thickness of the source-drain pattern can be alleviated, and the surface flatness of the array substrate is improved. Further, the flatness of the film layer on the array substrate can be improved to prevent concentrated reflection in a certain direction when external light enters the display panel and is reflected by the surface of the film layer. Therefore, the color separation phenomenon can be avoided and the product reliability can be improved.

Figure 5:
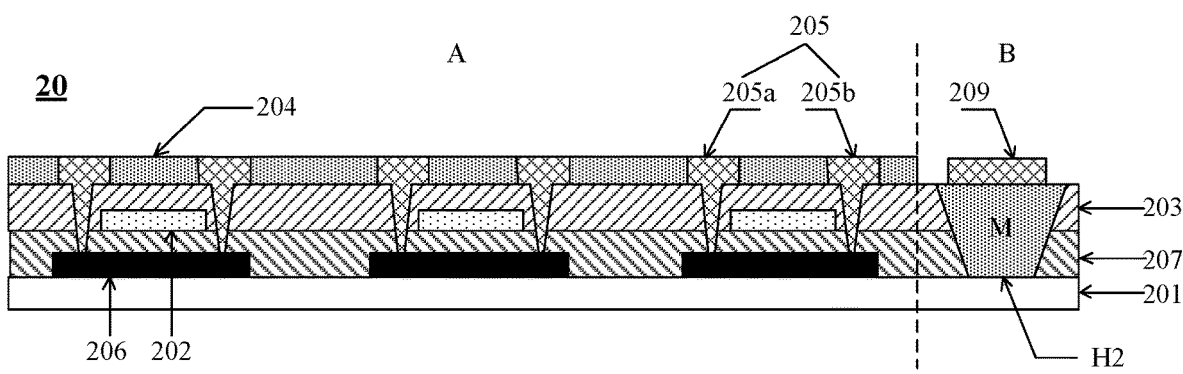
FIG. 5 is a schematic structural diagram of an array substrate provided by still another embodiment of the present disclosure.

Optionally, the base substrate is a flexible base substrate. For example, the base substrate may be made of polyethylene terephthalate (PET) plastic film or PI plastic film. FIG. 5 is a schematic structural diagram of an array substrate provided by yet another embodiment of the present disclosure. As shown in FIG. 5, the non-display area B includes a bending area, and a second slot H2 is provided in the bending area. The second slot H2 is provided with an organic filler M. The array substrate includes a trace 209 (i.e., a trace 209 in the non-display area B) located in the bending area, and the trace 209 is located on a side of the organic filler M away from the base substrate 201.

Optionally, the thickness of the organic filler ranges from 0.5 to 1.5 microns.

It should be noted that the inorganic film layer (including the passivation layer and the interlayer insulating layer, etc.) has high rigidity and is prone to break when bent. When the traces in the bending area are formed on the inorganic film layer, the breakage of the inorganic film layer is likely to cause the traces to break, affecting the normal display of the display panel. Currently, the inorganic film layer in the bending area is usually etched to form a slot, and an organic filler is provided in the slot. Since the organic filler has good flexibility and a low possibility of breaking when bent, the risk of breaking the traces can be reduced, and the reliability of the array substrate can be improved.

Optionally, the planarization pattern and the organic filler are formed by the same process. It should be noted that the preparation of the planarization pattern and the organic filler through the same process does not require adding new process steps to prepare the planarization pattern, that is, there is no need to add additional process cost, and the realizability is relatively high. Optionally, the planarization pattern and the organic filler can also be prepared separately through different processes, which is not limited in the embodiments of the present disclosure.

Optionally, the base substrate may also be a rigid base substrate. For example, the base substrate may be made of materials such as glass, silicon wafer and quartz. The embodiments of the present disclosure do not limit the material of the base substrate.

Figure 6:
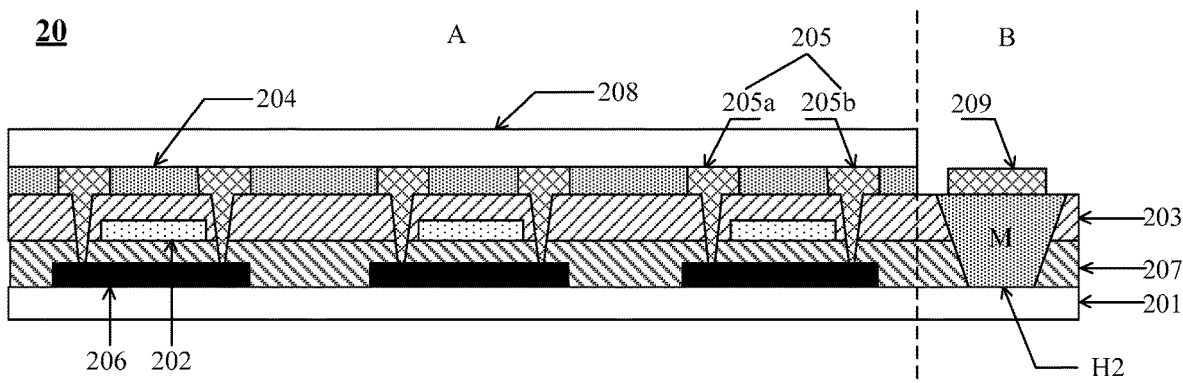
FIG. 6 is a schematic structural diagram of an array substrate provided by yet another embodiment of the present disclosure.

FIG. 6 is a schematic structural diagram of an array substrate provided by yet another embodiment of the present disclosure. As shown in FIG. 6, the array substrate 20 further includes a planarization layer 208. The planarization layer 208 is located on the side of the source-drain pattern 205 away from the base substrate 201.

It should be noted that, by providing a planarization layer on the side of the source-drain pattern away from the base substrate, the flatness of the array substrate can be further improved, thereby further improving the flatness of the subsequently prepared film layer.

In summary, in the array substrate provided by the embodiments of the present disclosure, the surface of the planarization pattern away from the base substrate and the surface of the source-drain pattern away from the base substrate are substantially in the same plane. Moreover, the planarization pattern has the first slot for accommodating the source-drain pattern, that is, the source-drain pattern can be accommodated in the first slot of the planarization pattern. Therefore, the problem of poor flatness of the array substrate due to the large thickness of the source-drain pattern can be alleviated, and the surface flatness of the array substrate is improved. Further, the flatness of the film layer on the array substrate can be improved to prevent concentrated reflection in a certain direction when external light enters the display panel and is reflected by the surface of the film layer. Therefore, the color separation phenomenon can be avoided and the product reliability can be improved.

An embodiment of the present disclosure provides a display panel. The display panel includes the array substrate 20 as shown in any one of FIGS. 2 and 4 to 6.

Figure 7:
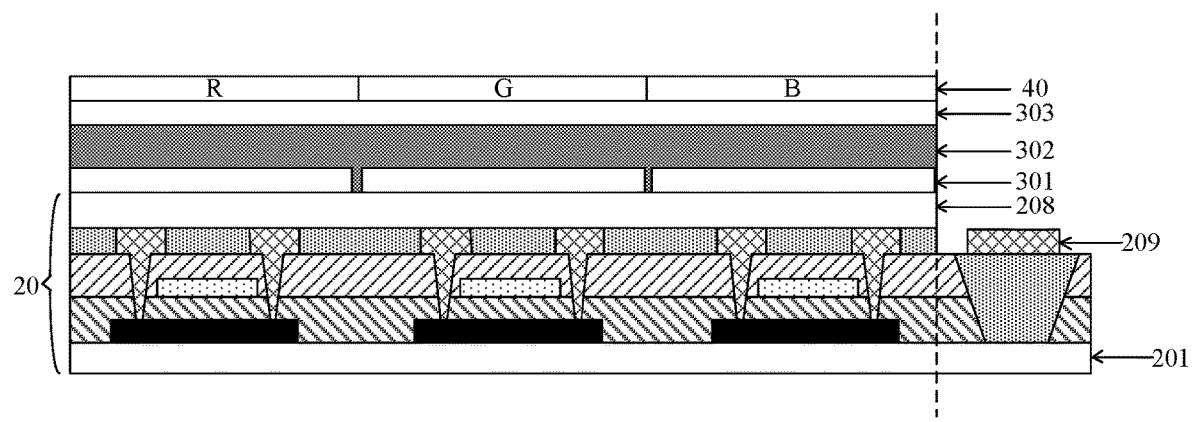
FIG. 7 is a schematic structural diagram of a display panel provided by an embodiment of the present disclosure.

Optionally, FIG. 7 is a schematic structural diagram of a display panel provided by an embodiment of the present disclosure. As shown in FIG. 7, the display panel includes the array substrate 20 shown in FIG. 6. The array substrate 20 further includes a planarization layer 208 located on the side of the source-drain pattern 205 away from the base substrate 201.

Referring to FIG. 7, the display panel further includes a first electrode 301, a light-emitting layer 302, a second electrode 303, and a color filter 40 stacked on the side of the planarization layer 208 away from the base substrate 201. The first electrode and the second electrode are a cathode and an anode, respectively (or, an anode and a cathode, respectively). The light-emitting layer includes a first carrier injection layer, a first carrier transport layer, a light-emitting material layer, a second carrier transport layer, and a second carrier injection layer stacked in a direction away from the first electrode. The first carrier and the second carrier are electron and hole, respectively (or, hole and electron, respectively). When the first electrode is an anode and the second electrode is a cathode, the first carrier is hole and the second carrier is electron; when the first electrode is a cathode and the second electrode is an anode, the first carrier is electron and the second carrier is hole.

Optionally, there are multiple pixels in the display area of the display panel. When each pixel includes a red sub-pixel, a green sub-pixel, and a blue sub-pixel, referring to FIG. 7, the color filter 40 has a red filter region R, a green filter region G, and a blue filter region B. On the one hand, the color filter can filter the outgoing light to improve the color purity of the outgoing light; on the other hand, the color filter can filter the external light, which can reduce the ambient light entering the display panel, thereby reducing the reflection of the ambient light by the display panel and improving the user experience.

It should be noted that the structure composed of the stacked first electrode, the light-emitting layer and the second electrode can also be referred to as a light-emitting device. In the embodiments of the present disclosure, the light-emitting device may be an OLED device, a quantum dot light-emitting diode (QLED) device, or the like.

Figure 8:
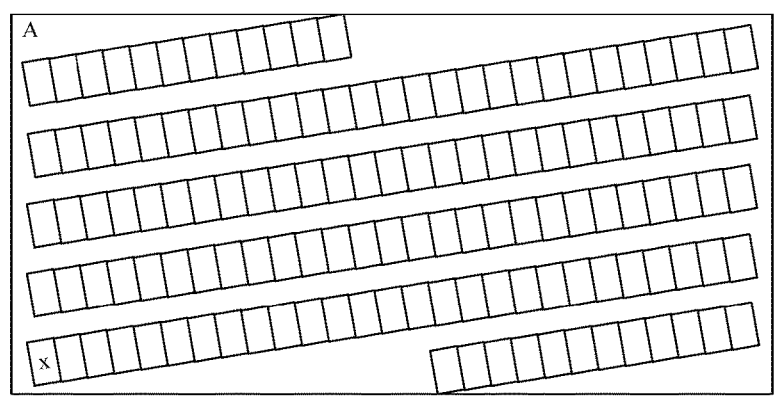
FIG. 8 is a schematic diagram of pixel distribution in a display panel provided by an embodiment of the present disclosure.

FIG. 8 is a schematic diagram of pixel distribution in a display panel provided by an optional embodiment of the present disclosure. As shown in FIG. 8, the display panel has two parallel sides disposed opposite to each other. The display area A includes a plurality of pixels x, and an arrangement direction of the plurality of pixels x is different from the two parallel sides. Each pixel x includes sub-pixels of at least one color.

It should be noted that the arrangement direction of the plurality of pixels x is different from the two parallel sides, such a configuration can improve the color separation phenomenon of the display panel and improve the product reliability of the display panel.

Therefore, in the array substrate provided by the embodiments of the present disclosure, the surface of the planarization pattern away from the base substrate and the surface of the source-drain pattern away from the base substrate are substantially in the same plane. Moreover, the planarization pattern has the first slot for accommodating the source-drain pattern, that is, the source-drain pattern can be accommodated in the first slot of the planarization pattern. Therefore, the problem of poor flatness of the array substrate due to the large thickness of the source-drain pattern can be alleviated, and the surface flatness of the array substrate is improved. Further, the flatness of the film layer on the array substrate can be improved to prevent concentrated reflection in a certain direction when external light enters the display panel and is reflected by the surface of the film layer. Therefore, the color separation phenomenon can be avoided and the product reliability can be improved.

An embodiment of the present disclosure provides a display device including the display panel shown in FIG. 7.

Optionally, the display device provided by the embodiment of the present disclosure may be any product or component with display function, such as electronic paper, mobile phone, tablet computer, TV, display, notebook computer, digital photo frame, navigator and so on.

Figure 9:
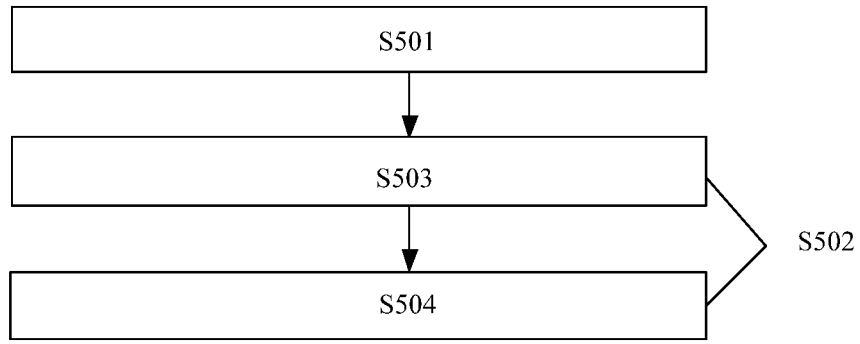
FIG. 9 is a flowchart of a method for manufacturing an array substrate provided by an embodiment of the present disclosure.

FIG. 9 is a flowchart of a method for manufacturing an array substrate provided by an embodiment of the present disclosure. The array substrate has a display area and a non-display area located around the display area. As shown in FIG. 9, the method includes the following steps: S501, providing a base substrate; and S502, forming a thin film transistor structure on the base substrate, the thin film transistor structure being in the display area. The step of forming the thin film transistor structure on the base substrate at least includes: S503, forming a planarization pattern on the base substrate, the planarization pattern having a first slot; and S504, forming a source-drain pattern in the first slot. A surface of the planarization pattern away from the base substrate and a surface of the source-drain pattern away from the base substrate are substantially in a same plane.

Optionally, by using the manufacturing method of the array substrate shown in FIG. 9, the array substrate shown in FIG. 2 or FIG. 4 can be prepared. For the structure of the array substrate, reference may be made to the embodiments on the structure, which will not be repeated herein.

In summary, the method for manufacturing an array substrate provided by the embodiments of the present disclosure first forms the planarization pattern on the base substrate, and then forms the source-drain pattern on the base substrate on which the planarization pattern is formed. The surface of the planarization pattern away from the base substrate and the surface of the source-drain pattern away from the base substrate are substantially in the same plane. Moreover, the planarization pattern has the first slot for accommodating the source-drain pattern, that is, the source-drain pattern can be accommodated in the first slot of the planarization pattern. Therefore, the problem of poor flatness of the array substrate due to the large thickness of the source-drain pattern can be alleviated, and the surface flatness of the array substrate is improved. Further, the flatness of the film layer on the array substrate can be improved to prevent concentrated reflection in a certain direction when external light enters the display panel and is reflected by the surface of the film layer. Therefore, the color separation phenomenon can be avoided and the product reliability can be improved.

Optionally, when the array substrate has a top gate structure, before S503 is performed, the above method further includes sequentially forming an active layer pattern, a passivation layer, a gate pattern, and an interlayer insulating layer on the base substrate. When the array substrate has a bottom gate structure, before S503 is performed, the above method further includes sequentially forming a gate pattern, an interlayer insulating layer and an active layer on the base substrate. The following embodiments of the present disclosure take the array substrate having the top gate structure as an example to describe the manufacturing process of the array substrate. The manufacturing process of the array substrate having the bottom gate structure can refer to the manufacturing process of the array substrate having the top gate structure, which will not be repeated herein.

Figure 10:
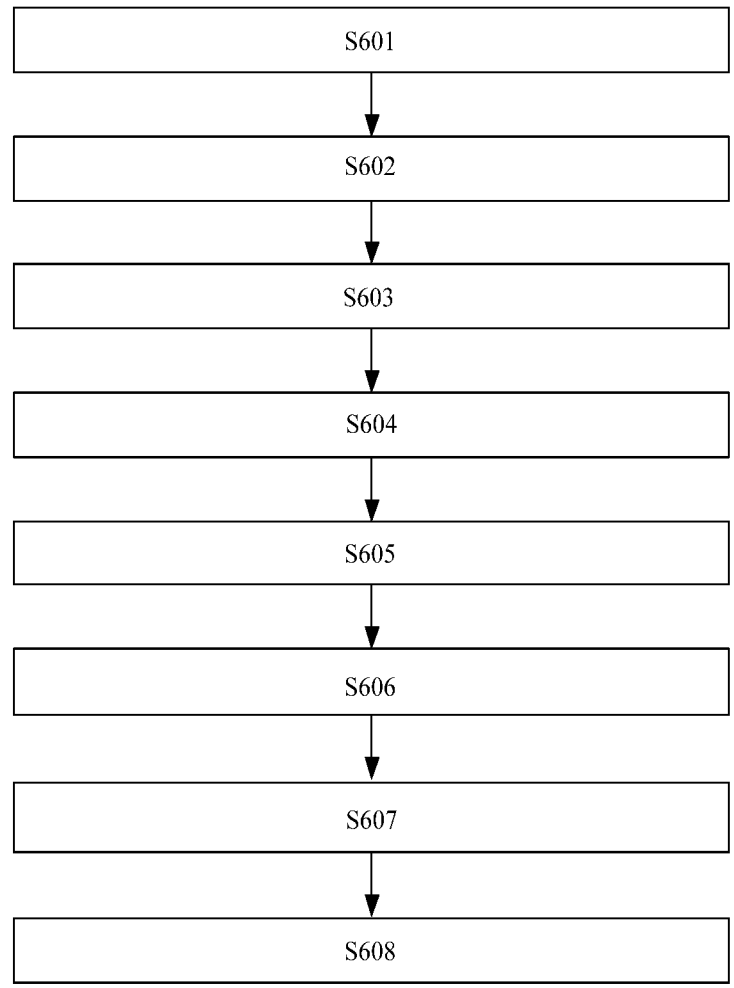
FIG. 10 is a flowchart of a method for manufacturing an array substrate provided by another embodiment of the present disclosure.

FIG. 10 is a flowchart of a method for manufacturing an array substrate provided by another embodiment of the present disclosure. The array substrate has a display area and a non-display area located around the display area. As shown in FIG. 10, the method includes the following steps.

S601, providing a base substrate.

Optionally, the base substrate is a flexible base substrate, for example, the base substrate may be made of PET plastic film or PI plastic film. Alternatively, the base substrate may also be a rigid base substrate. For example, the base substrate may be made of materials such as glass, silicon wafer, and quartz. The embodiments of the present disclosure do not limit the material of the base substrate.

S602: forming an active layer pattern on the base substrate.

Optionally, the material of the active layer pattern includes at least one of indium gallium zinc oxide (IGZO), monocrystalline silicon (a-Si), low temperature polysilicon (LTPS), and low temperature polycrystalline oxide. For example, the active layer pattern may be formed on the base substrate by means of deposition.

S603: forming a passivation layer on the base substrate on which the active layer pattern is formed.

Optionally, the material of the passivation layer includes at least one of silicon dioxide or silicon nitride.

S604: forming a gate pattern on the base substrate on which the passivation layer is formed.

Optionally, the material of the gate pattern includes at least one of aluminum, neodymium, and molybdenum. A gate layer can be formed by deposition, and then the gate pattern can be formed by a patterning process. In the embodiments of the present disclosure, the patterning process includes: photoresist coating, exposure, development, etching, and photoresist stripping. The gate pattern may have a two-layer structure, which is not limited in the embodiments of the present disclosure.

S605: forming an interlayer insulating layer on the base substrate on which the gate pattern is formed.

Optionally, the material of the interlayer insulating layer includes at least one of silicon dioxide, silicon nitride, and aluminum oxide. For example, by deposition, the interlayer insulating layer may be formed on the base substrate on which the gate pattern is formed.

Optionally, a through hole may be formed on the interlayer insulating layer and the passivation layer by a patterning process, and the through hole may be used to connect the active layer and the source-drain pattern. The through hole on the interlayer insulating layer and the passivation layer may be prepared by a single patterning process, or may be prepared by respective patterning processes, which is not limited in the embodiments of the present disclosure.

S606: form a planarization pattern on a side of the interlayer insulating layer away from the base substrate, the planarization pattern having a first slot.

Optionally, the implementation process of step S606 includes: coating an organic material on the side of the interlayer insulating layer away from the base substrate to form an organic material layer in the display area, the thickness of the organic material layer being greater than or equal to that of the source-drain pattern; and performing an exposure and development process on the organic material layer to obtain the planarization pattern. The material of the planarization pattern may include organic materials such as PI and acrylic.

Optionally, the above-mentioned through hole for connecting the active layer and the source-drain pattern can also be formed on the interlayer insulating layer and the passivation layer after the planarization pattern is formed, and those skilled in the art can select a specific process, which is not limited in the present disclosure.

Optionally, when the base substrate is a flexible base substrate, the non-display area includes a bending area, and before coating the organic material on the base substrate on which the interlayer insulating layer is formed, the inorganic film layer (including the passivation layer and the interlayer insulating layer, etc.) in the bending area should be etched to form a second slot.

Optionally, the step of coating the organic material on the side of the interlayer insulating layer away from the base substrate may further include: filling the second slot with an organic material to form an organic filler in the second slot. That is, the organic filler in the bending area and the planarization pattern in the display area are formed by the same process.

It should be noted that the inorganic film layer has high rigidity and is prone to break when bent. When the traces in the bending area are formed on the inorganic film layer, the breakage of the inorganic film layer is likely to cause the traces to break, affecting the normal display of the display panel. Currently, the inorganic film layer in the bending area is usually etched to form a slot, and an organic filler is provided in the slot. Since the organic filler has good flexibility and a low possibility of breaking when bent, the risk of breaking the traces can be reduced, and the reliability of the array substrate can be improved. Moreover, since the planarization pattern and the organic filler are prepared by the same process, no additional processes are needed to prepare the planarization pattern, and the material of the planarization pattern is same to the material of the organic filler. Therefore, no additional process cost is required, and the realizability is relatively high.

Optionally, the planarization pattern and the organic filler can also be prepared separately, which is not limited in the embodiments of the present disclosure.

Optionally, due to process errors, when forming the first slot on the planarization pattern, a certain error size is reserved in the first slot to improve the matching between the source-drain pattern and the planarization pattern. That is, there may be a certain gap between the actually formed planarization pattern and the source-drain pattern. The gap between the planarization pattern and the source-drain pattern is not shown in FIGS. 2, 4, 5, 6, and 7, but the drawings are only schematic and do not represent limitations on the present disclosure.

Figure 11:
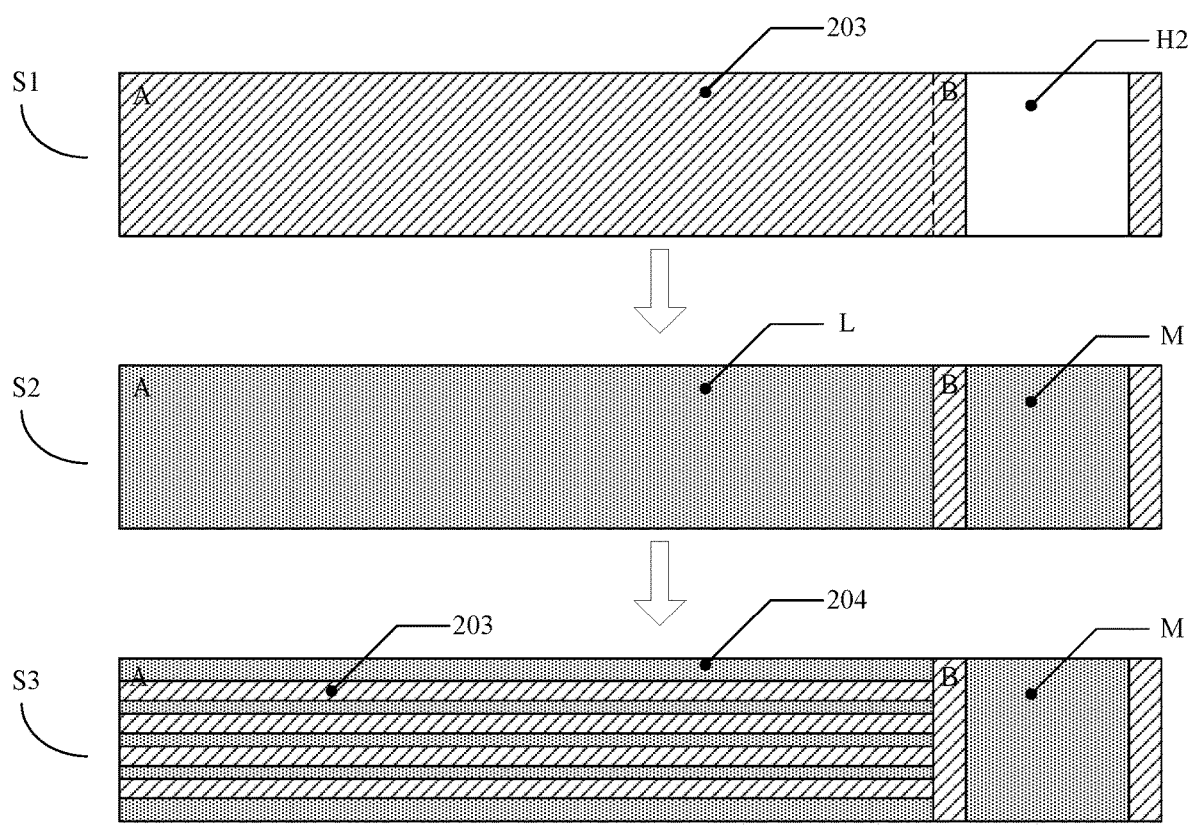
FIG. 11 shows schematic diagrams of a process flow for forming a planarization pattern on a side of an interlayer insulating layer away from a base substrate provided by an embodiment of the present disclosure.

Illustratively, FIG. 11 shows schematic diagrams of a process flow for forming a planarization pattern on a side of an interlayer insulating layer away from a base substrate provided by an embodiment of the present disclosure (top views). As shown in FIG. 11, the process flow may include the following steps.

S1: providing a base substrate, forming an interlayer insulating layer 203 on the base substrate, and forming a second slot H2 in the bending area of the non-display area.

Optionally, the depth of the second slot ranges from 0.5 to 1.5 microns.

S2: coating an organic material on the side of the interlayer insulating layer far away from the base substrate, forming an organic material layer L in the display area A, and forming an organic filler M in the second slot H2.

Optionally, since the depth of the second slot ranges from 0.5 to 1.5 microns, the thickness of the organic filler formed in the second slot ranges from 0.5 to 1.5 microns, that is, the thickness of the organic material layer is 0.5 to 1.5 microns.

S3: performing an exposure and development process on the organic material layer L in the display area A to obtain the planarization pattern 204.

Optionally, the thickness of the source-drain pattern generally ranges from 300 to 800 nm. When the thickness of the organic material layer is greater than the thickness of the source-drain pattern, after the planarization pattern is obtained, an exposure process may be performed on the planarization pattern using a halftone mask. After the exposure process, a development process may be performed on the planarization pattern, so that the thickness of the planarization pattern after the development process is equal to the thickness of the source-drain pattern. Alternatively, an ashing process may be used to ash the planarization pattern so that the thickness of the planarization pattern after the ashing process is equal to the thickness of the source-drain pattern.

It should be noted that since the thickness of the planarization pattern is equal to the thickness of the source-drain pattern, when the source-drain pattern is accommodated in the first slot of the planarization pattern, the surface of the source-drain pattern away from the base substrate and the surface of the planarization pattern away from the base substrate are flush (i.e., in the same plane), which further improves the flatness of the array substrate.

S607: forming the source-drain pattern on the base substrate on which the planarization pattern is formed, the surface of the planarization pattern away from the base substrate and the source-drain pattern away from the base substrate being substantially in the same plane, and the source-drain pattern being accommodated in the first slot.

Optionally, the material of the source-drain pattern includes at least one of aluminum, neodymium, and molybdenum. By applying a patterning process, the source-drain pattern may be formed on the base substrate on which the planarization pattern is formed. The preparation temperature of the source-drain pattern is generally 200 to 250° C. Alternatively, other low temperature processes may be used to prepare the source-drain pattern.

Referring to step S606, when the base substrate is a flexible base substrate, the array substrate includes a trace in the bending area. While forming the source-drain pattern in the first slot, the method further includes forming the trace on a side of the organic filler away from the base substrate through a patterning process.

S608: forming a planarization layer on the side of the source-drain pattern away from the base substrate.

Optionally, the planarization layer is formed on the side of the source-drain pattern away from the base substrate by a deposition or coating process. It should be noted that, by forming the planarization layer on the side of the source-drain pattern away from the base substrate, the flatness of the array substrate can be further improved, thereby improving the preparation reliability of subsequent film layer(s).

Optionally, by using the manufacturing method of the array substrate shown in FIG. 10, the array substrate shown in FIG. 6 can be obtained. For the structure of the array substrate, reference may be made to the embodiments on the structure, which will not be repeated herein.

It should be noted that the sequence of the steps of the method for manufacturing the array substrate provided by the embodiments of the present disclosure can be adjusted appropriately, and the steps can also be increased or decreased according to the actual situation. The ordinary skilled person in the related technical field, in the case of not departing from the spirit and scope of the present disclosure, may also make various modifications and variations, therefore, all the equivalent solutions also belong to the scope of the present disclosure, and thus will not be described in detail.

In summary, the method for manufacturing an array substrate provided by the embodiments of the present disclosure first forms the planarization pattern on the base substrate, and then forms the source-drain pattern on the base substrate on which the planarization pattern is formed. The surface of the planarization pattern away from the base substrate and the surface of the source-drain pattern away from the base substrate are substantially in the same plane. Moreover, the planarization pattern has the first slot for accommodating the source-drain pattern, that is, the source-drain pattern can be accommodated in the first slot of the planarization pattern. Therefore, the problem of poor flatness of the array substrate due to the large thickness of the source-drain pattern can be alleviated, and the surface flatness of the array substrate is improved. Further, the flatness of the film layer on the array substrate can be improved to prevent concentrated reflection in a certain direction when external light enters the display panel and is reflected by the surface of the film layer. Therefore, the color separation phenomenon can be avoided and the product reliability can be improved.

The above are only optional embodiments of the present disclosure and are not intended to limit the present disclosure. Any modification, equivalent replacement, improvement, etc. within the spirit and principle of the present disclosure shall be included in the protection scope of the present disclosure.

What is claimed is:

1. An array substrate with a display area, comprising:
a base substrate; and
a thin film transistor structure on a surface of the base substrate,
wherein the thin film transistor structure is in the display area,
wherein the thin film transistor structure comprises a source-drain pattern and a planarization pattern,
wherein the source-drain pattern and the planarization pattern are on a side of the thin film transistor structure away from the base substrate,
wherein a surface of the planarization pattern away from the base substrate and a surface of the source-drain pattern away from the base substrate are substantially in a same plane,
wherein the planarization pattern comprises a first slot, and
wherein the source-drain pattern is in the first slot.

2. The array substrate according to claim 1, further comprising:
a non-display area adjacent to the display area and a trace in the non-display area,
wherein the base substrate comprises a flexible base substrate, the non-display area comprises a bending area, the bending area comprises a second slot, and an organic filler is in the second slot, and
wherein the trace is on a side of the organic filler away from the base substrate.

3. The array substrate according to claim 2, wherein a material of the planarization pattern is same as a material of the organic filler.

4. The array substrate of claim 1, further comprising:
a planarization layer,
wherein the planarization layer is on a side of the source-drain pattern away from the base substrate.

5. The array substrate according to claim 1,
wherein the thin film transistor structure further comprises an active layer pattern, a passivation layer, and a gate pattern sequentially stacked on the base substrate, and
wherein the source-drain pattern is connected to the active layer pattern via a through hole passing through the passivation layer.

6. The array substrate according to claim 1,
wherein the thin film transistor structure further comprises a gate pattern, an interlayer insulating layer, and an active layer pattern sequentially stacked on the base substrate, and
wherein the source-drain pattern is connected to the active layer pattern.

7. A display panel comprising the array substrate according to claim 1.

8. The display panel according to claim 7, further comprising:
a first electrode;
a light-emitting layer;
a second electrode; and
a color filter stacked on a side of the planarization pattern away from the base substrate,
wherein the first electrode and the second electrode comprise a cathode and an anode, respectively.

9. The display panel according to claim 7,
wherein the display panel has two parallel sides opposite to each other
wherein the display area comprises a plurality of pixels, and
wherein an arrangement direction of the plurality of pixels is different from the two parallel sides.

10. A display device comprising the display panel according to claim 7.

11. The display panel according to claim 7, further comprising:
a non-display area adjacent to the display area; and
a trace in the non-display area,
wherein the base substrate is a flexible base substrate, the non-display area comprises a bending area, the bending area comprises a second slot, and an organic filler is in the second slot, and
wherein the trace is on a side of the organic filler away from the base substrate.

12. The display panel according to claim 7, further comprising:
a planarization layer,
wherein the planarization layer is on a side of the source-drain pattern away from the base substrate.

13. The display panel according to claim 7,
wherein the thin film transistor structure further comprises an active layer pattern, a passivation layer, and a gate pattern sequentially stacked on the base substrate, and
wherein the source-drain pattern is connected to the active layer pattern via a through hole passing through the passivation layer.

14. The display panel according to claim 7,
wherein the thin film transistor structure further comprises a gate pattern, an interlayer insulating layer, and an active layer pattern sequentially stacked on the base substrate, and
wherein the source-drain pattern is connected to the active layer pattern.

15. A method of manufacturing an array substrate, the array substrate having a display area, the method comprising:
providing a base substrate; and
forming a thin film transistor structure on the base substrate, wherein the thin film transistor structure is in the display area,
wherein forming the thin film transistor structure on the base substrate comprises:
forming a planarization pattern on the base substrate, the planarization pattern comprising a first slot; and
forming a source-drain pattern in the first slot,
wherein a surface of the planarization pattern away from the base substrate and a surface of the source-drain pattern away from the base substrate are substantially in a same plane.

16. The method of claim 15, wherein forming the planarization pattern on the base substrate comprises:
coating an organic material on the base substrate to form an organic material layer in the display area, wherein a thickness of the organic material layer is greater than or equal to a thickness of the source-drain pattern; and
performing an exposure and development process on the organic material layer in the display area to obtain the planarization pattern.

17. The method according to claim 16, wherein the array substrate further comprises a non-display area adjacent to the display area, wherein the base substrate is a flexible base substrate, wherein the non-display area comprises a bending area, and wherein before coating the organic material on the base substrate, the method further comprises:
etching an inorganic film layer in the bending area to form a second slot,
wherein coating the organic material on the base substrate comprises:
filling the organic material in the second slot to form an organic filler in the second slot.

18. The method according to claim 17, wherein the array substrate comprises a trace in the bending area, and wherein while forming the source-drain pattern in the first slot, the method further comprises:
forming the trace on a side of the organic filler away from the base substrate through a patterning process.

19. The method of claim 16, wherein the thickness of the organic material layer is greater than the thickness of the source-drain pattern and wherein after the planarization pattern is obtained, the method further comprises:
performing an exposure process on the planarization pattern using a half-tone mask; and
performing a development process on the planarization pattern after the exposure process is performed so that a thickness of the planarization pattern after the development process is equal to the thickness of the source-drain pattern.

20. The method according to claim 16, wherein the thickness of the organic material layer is greater than the thickness of the source-drain pattern, and wherein after the planarization pattern is obtained, the method further comprises:
    performing an ashing process on the planarization pattern to ash the planarization pattern so that a thickness of the planarization pattern after the ashing process is equal to the thickness of the source-drain pattern.

\* \* \* \* \*